United States Patent
Lee et al.

(10) Patent No.: US 11,194,083 B2
(45) Date of Patent: Dec. 7, 2021

(54) COLOR FILTER INCLUDING QUANTUM DOTS AND METAL NANOPARTICLES AND DISPLAY APPARATUS INCLUDING THE SAME

(71) Applicant: Samsung Display Co., Ltd., Yongin-si (KR)

(72) Inventors: Minsu Lee, Yongin-si (KR); Dohyun Kwon, Yongin-si (KR); Younjoon Kim, Yongin-si (KR); Mira Oh, Yongin-si (KR); Minjung Lee, Yongin-si (KR); Junghun Lee, Yongin-si (KR); Choongyoul Im, Yongin-si (KR); Mi Jang, Yongin-si (KR); Kyungmin Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 266 days.

(21) Appl. No.: 15/083,535

(22) Filed: Mar. 29, 2016

(65) Prior Publication Data

US 2017/0102487 A1 Apr. 13, 2017

(30) Foreign Application Priority Data

Oct. 7, 2015 (KR) .................. 10-2015-0141042

(51) Int. Cl.
*G02B 5/20* (2006.01)
*G03F 7/004* (2006.01)
(Continued)

(52) U.S. Cl.
CPC ............ *G02B 5/201* (2013.01); *G02B 5/206* (2013.01); *G02F 1/133514* (2013.01); *G03F 7/0007* (2013.01); *G03F 7/0047* (2013.01); *G03F 7/2053* (2013.01); *H01L 27/322* (2013.01); *B82Y 20/00* (2013.01);
(Continued)

(58) Field of Classification Search
CPC combination set(s) only.
See application file for complete search history.

(56) References Cited

U.S. PATENT DOCUMENTS 6,555,255 B2 * 4/2003 Barton ............... C09C 3/10
313/503
8,748,875 B2 6/2014 Koresawa et al.
(Continued)

FOREIGN PATENT DOCUMENTS

CN 102201552 9/2011
CN 102577610 7/2012
(Continued)

OTHER PUBLICATIONS

Chinese Office Action dated Jun. 3, 2021, issued in Chinese Patenet Application No. 201610674718.8. (with English Concise Explanation).

*Primary Examiner* — Lauren Nguyen
(74) *Attorney, Agent, or Firm* — H.C. Park & Associates, PLC

(57) ABSTRACT

A color filter and a display apparatus employing the color filter are provided. The color filter includes a base substrate and a color photoresist layer disposed on the base substrate. The color photoresist layer includes a photopolymerized photosensitive composition, at least one of a pigment and a dye, and quantum dots.

17 Claims, 24 Drawing Sheets

(51) Int. Cl.
*G03F 7/20* (2006.01)
*G02F 1/1335* (2006.01)
*G03F 7/00* (2006.01)
*H01L 27/32* (2006.01)
*B82Y 20/00* (2011.01)

(52) U.S. Cl.
CPC ........ *C09K 2323/031* (2020.08); *G02B 5/207* (2013.01); *G02B 2207/101* (2013.01); *G02F 2202/36* (2013.01); *G02F 2203/01* (2013.01); *G02F 2203/02* (2013.01); *G02F 2203/05* (2013.01); *Y10S 977/774* (2013.01)

(56) References Cited

U.S. PATENT DOCUMENTS

| | | | |
|---|---|---|---|
| 9,540,516 B2 | 1/2017 | Lun et al. | |
| 9,740,048 B2 | 8/2017 | Wang et al. | |
| 9,971,075 B2 | 5/2018 | Jiang et al. | |
| 2009/0091689 A1 | 4/2009 | Rho et al. | |
| 2011/0261303 A1 | 10/2011 | Jang et al. | |
| 2012/0050632 A1* | 3/2012 | Shih | B82Y 20/00 349/42 |
| 2012/0326180 A1* | 12/2012 | Ohe | H01L 51/5265 257/88 |
| 2013/0234068 A1* | 9/2013 | Chiu | B82Y 30/00 252/301.35 |
| 2015/0285969 A1* | 10/2015 | Kim | G02B 5/201 359/891 |
| 2015/0293280 A1 | 10/2015 | Lee et al. | |
| 2015/0309359 A1* | 10/2015 | Wu | G02F 1/133514 359/891 |
| 2016/0178966 A1 | 6/2016 | Li et al. | |
| 2016/0362602 A1 | 12/2016 | Xin et al. | |

FOREIGN PATENT DOCUMENTS

| | | | | |
|---|---|---|---|---|
| CN | 103146262 | | 6/2013 | |
| CN | 103772872 | | 5/2014 | |
| CN | 104267520 | | 1/2015 | |
| CN | 104479680 | | 4/2015 | |
| CN | 104516039 | | 4/2015 | |
| CN | 104932136 | | 9/2015 | |
| JP | 2009-251129 | | 10/2009 | |
| KR | 10-2006-0024545 | | 3/2006 | |
| KR | 10-2007-0094679 | | 9/2007 | |
| KR | 10-2009-0036373 | | 4/2009 | |
| KR | 10-2012-0095486 | | 8/2012 | |
| KR | 10-2015-0117343 | | 10/2015 | |
| WO | WP-2011-136474 | * | 11/2011 | ............ G02F 1/167 |
| WO | 2014/173137 | | 10/2014 | |

* cited by examiner

COLOR FILTER INCLUDING QUANTUM DOTS AND METAL NANOPARTICLES AND DISPLAY APPARATUS INCLUDING THE SAME

CROSS-REFERENCE TO RELATED PATENT APPLICATION

This application claims priority from and the benefit of Korean Patent Application No. 10-2015-0141042, filed on Oct. 7, 2015, which is hereby incorporated by reference for all purposes as if fully set forth herein.

BACKGROUND

Field

One or more exemplary embodiments relate to a color filter and a display apparatus including the color filter.

Discussion of the Background

Color filters transmit light in a specific wavelength region from among visible light and thus generate color light. Color filters are used to display a color on a liquid crystal display (LCD). Color filters are also used to display a color on an organic light-emitting device (OLED) including a white emission layer. Solid state imaging devices, such as charge-coupled device (CCD) image sensors and complementary metal-oxide semiconductor (CMOS) image sensors may include the color filters to produce color images. Research has been made to improve the definition and brightness of the displays.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments provide color filters having improved color reproducibility and brightness, and displays including the color filters.

Additional aspects will be set forth in the detailed description which follows, and, in part, will be apparent from the disclosure, or may be learned by practice of the inventive concept.

According to one or more exemplary embodiments, a color filter includes a base substrate; and a color photoresist layer disposed on the base substrate, the color photoresist layer including a photopolymerized photosensitive composition, at least one of a pigment and a dye, and quantum dots.

According to one or more exemplary embodiments, a display apparatus includes: a display unit including a plurality of pixel regions which are controlled according to an image signal; and a color filter including a plurality of color filter regions corresponding to the plurality of pixel regions. Each of the plurality of color filter regions includes a color photoresist layer including a photopolymerized photosensitive composition, at least one of a pigment and a dye, and quantum dots.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
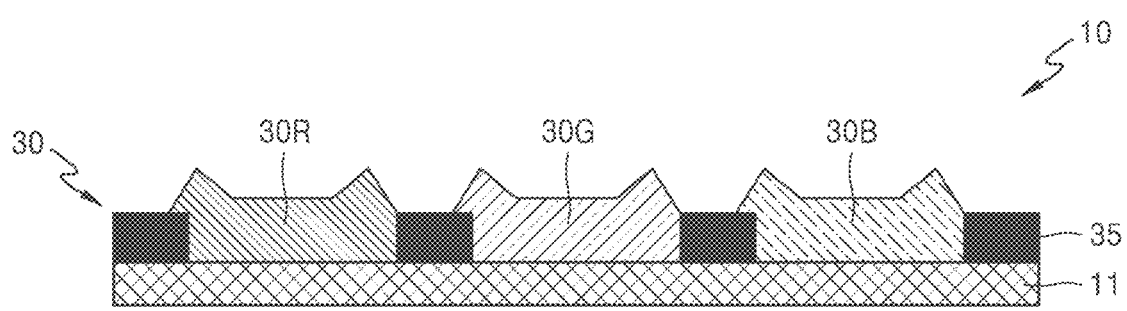
FIG. 1 is a schematic diagram of a color filter according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
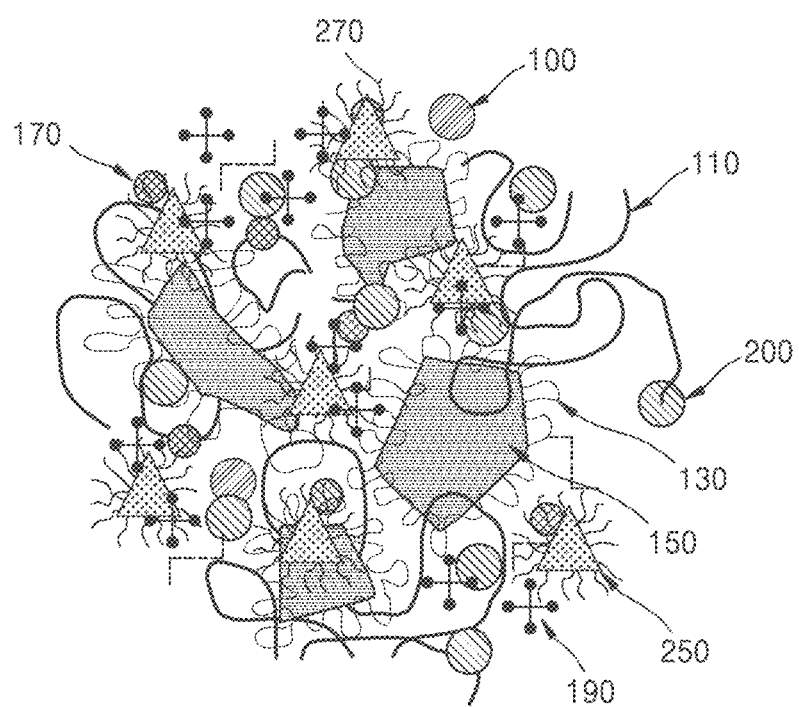
FIG. 2 is a color photoresist composition of the color filter of FIG. 1, according to one or more exemplary embodiments.

FIG. 1 is a schematic diagram of a color filter 10, according to one or more exemplary embodiments. FIG. 2 is a composition of a color photoresist of the color filter 10 of FIG. 1, according to one or more exemplary.

Referring to FIG. 1 and FIG. 2, the color filter 10 includes a color photoresist layer 30 disposed on a base substrate 11. The color photoresist layer 30 may include color photoresist. The color photoresist includes a photopolymerized photosensitive composition, at least one of a pigment 150 and a dye 170, and quantum dots 200. The photopolymerized photosensitive composition may include, for example, a photopolymerization initiator 100, a binder polymer 110, and a monomer 190. The color photoresist may further include metal nanoparticles 250. The color photoresist including the pigment 150 may further include a dispersing agent 130. The color photoresist including both the pigment 150 and the dye 170 may further include the dispersing agent 130. The color photoresist not including the pigment 150 but only including the dye 170 may not include the dispersing agent 130.

The color photoresist according to one or more exemplary embodiments, which may include the photopolymerized photosensitive composition including the photopolymerization initiator 100, the binder polymer 110, and the monomer 190, and at least one of the pigment 150 and the dye 170, may be a photoresist for color filters. The color photoresist may be configured to express different colors according to the pigment 150 and/or the dye 170 included in the color photoresist. Since the quantum dots 200 have a narrow color-formation wavelength, the quantum dots 200 may have improved color reproducibility. The quantum dots 200 may improve the brightness of the color filter 10 due to excitation of electrons and emission of photons. The metal nanoparticles 250 may increase extinction of photon in a specific wavelength according to the type of a material and/or a shape thereof. The increased extinction of photon may increase the excitation of electrons of quantum dots 200 around the metal nanoparticles 250. As the number of excited electrons increases, emission of photon from the quantum dots 200 increases.

The color filter 10 according to one or more exemplary embodiment may have improved brightness and/or color reproducibility by including the color photoresist layer 30 formed by coating color photoresist including the quantum dots 200. The color filter 10 according to one or more exemplary embodiments may have improve the brightness by including the color photoresist layer 30 formed by coating color photoresist including the metal nanoparticles 250 in addition to the quantum dots 200.

FIG. 2 is the color photoresist coated to form the color photoresist layer 30 of the color filter 10, according to one or more exemplary embodiment, and the color photoresist includes the pigment 150, the dye 170, the quantum dots 200, and the metal nanoparticles 250. The color photoresist is formed by dispersing the photopolymerized photosensitive composition including the photopolymerization initiator 100, the binder polymer 110, and the monomer 190, the pigment 150, the dye 170, the quantum dots 200, and the metal nanoparticles 250 into a solvent. The color photoresist including the pigment 150 may further include the dispersing agent 130. The color photoresist according to one or more exemplary embodiments may be coated onto the base substrate 11 to form the color photoresist layer 30.

FIGS. 3A, 3B, 3C, 3D, and 3E are compositions of the color photoresist included in the color filter 10 according to one or more exemplary embodiments.

Figure 3A:
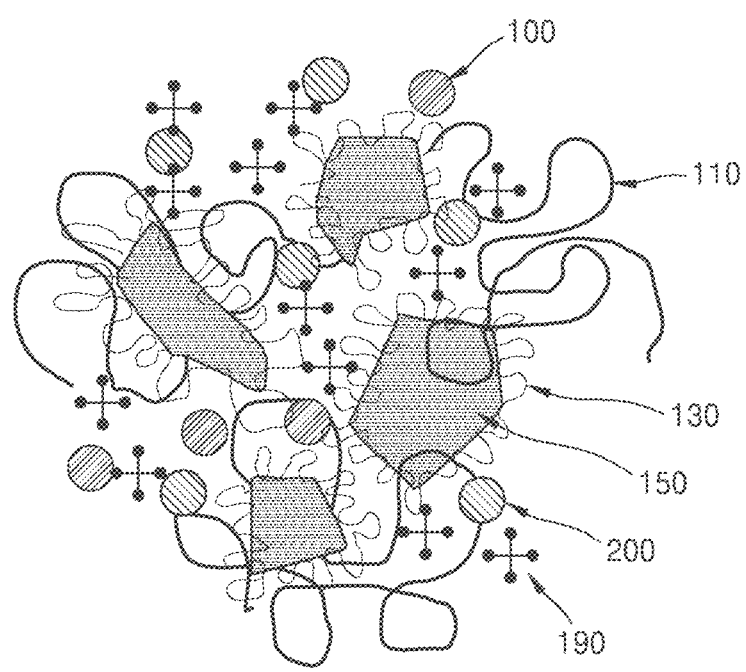
FIGS. 3A, 3B, 3C, 3D, and 3E are compositions of the color photoresist included in the color filter according to one or more exemplary embodiments.
Figure 3B:
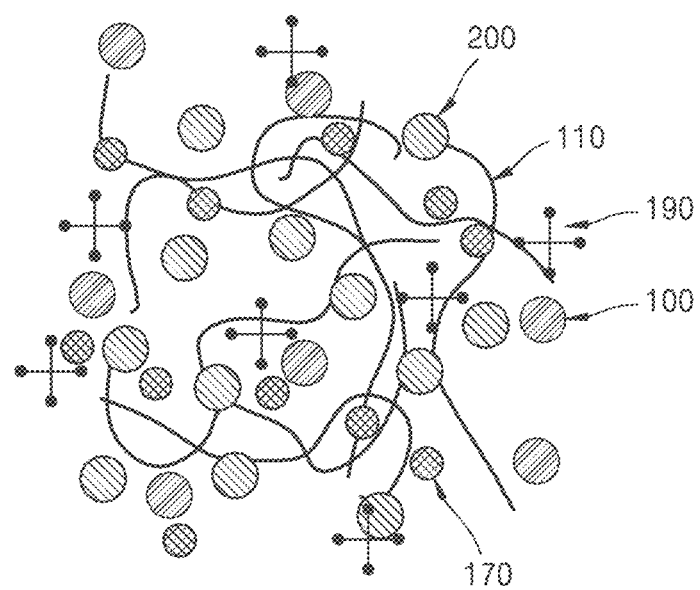
Figure 3C:
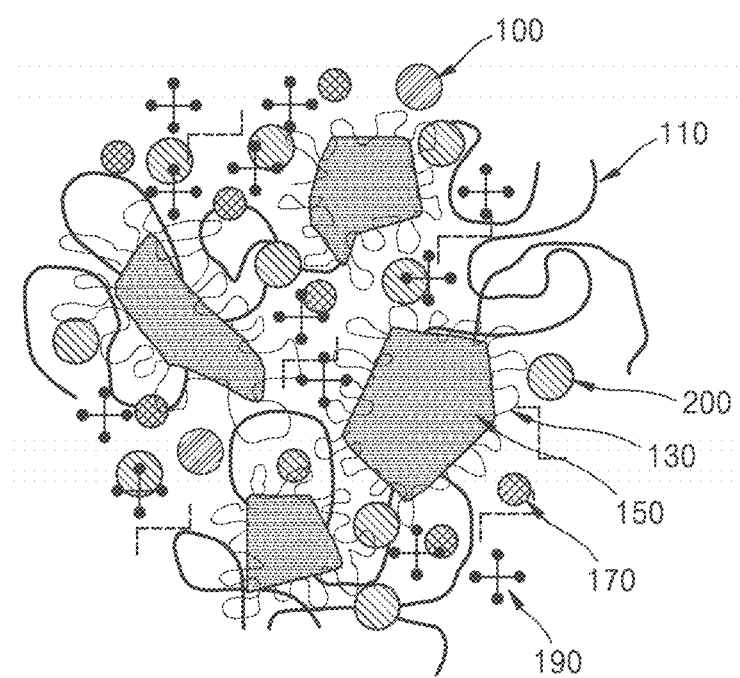
Figure 3D:
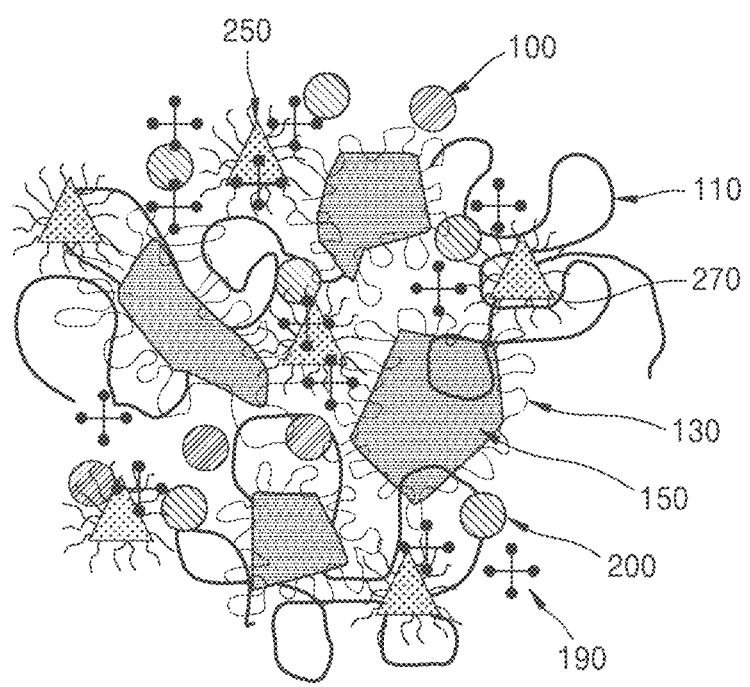
Figure 3E:
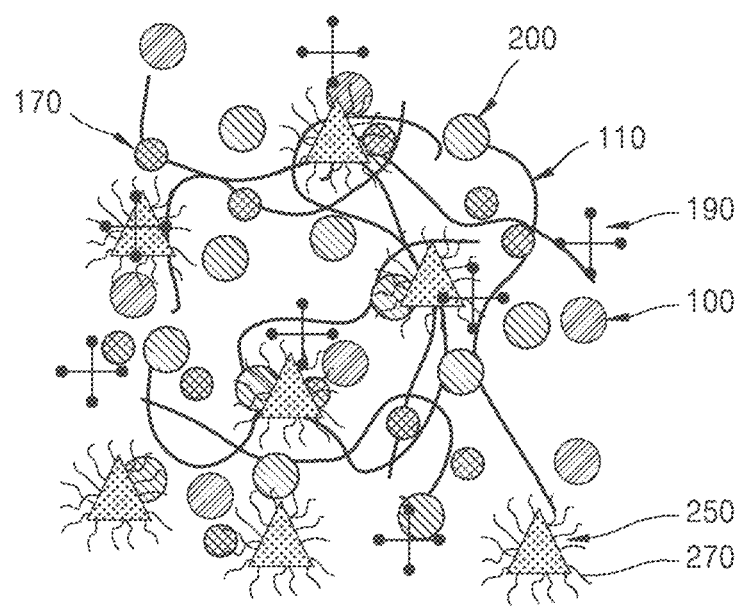

The color photoresists of FIGS. 3A, 3B, and 3C are formed by dispersing the photopolymerized photosensitive composition including the photopolymerization initiator 100, the binder polymer 110, and the monomer 190, at least one of the pigment 150 and the dye 170, and the quantum dots 200 into the solvent. The color photoresists of FIGS. 3D and 3E are formed by dispersing the photopolymerized photosensitive composition including the photopolymerization initiator 100, the binder polymer 110, and the monomer 190, at least one of the pigment 150 and the dye 170, the quantum dots 200, and the metal nanoparticles 250 into the solvent.

FIG. 3A illustrates a composition of the color photoresist including the pigment 150 and the quantum dots 200. Since the color photoresist includes the pigment 150, the color photoresist may also include the dispersing agent 130.

FIG. 3B illustrates a composition of the color photoresist including the dye 170 and the quantum dots 200. Since the color photoresist does not include the pigment 150, the color photoresist may not include the dispersing agent 130.

FIG. 3C illustrates a composition of the color photoresist including the pigment 150, the dye 170, and the quantum dots 200. Since the color photoresist includes the pigment 150, the color photoresist may also include the dispersing agent 130.

FIG. 3D illustrates a composition of the color photoresist including the pigment 150, the quantum dots 200, and the metal nanoparticles 250. Since the color photoresist includes the pigment 150, the color photoresist may also include the dispersing agent 130.

FIG. 3E illustrates an example in which the color photoresist includes the dye 170, the quantum dots 200, and the metal nanoparticles 250. Since the color photoresist does not include the pigment 150, the color photoresist may not include the dispersing agent 130.

Referring back to FIGS. 2, 3D, and 3E, when the color photoresist includes the quantum dots 200 and the metal nanoparticles 250, the color photoresist may further include alkyl groups 270 bonded with the metal nanoparticles 250. When the alkyl groups 270 are bonded with the metal nanoparticles 250, a distance between the metal nanoparticles 250 and the quantum dots 200 may be maintained.

Referring back to FIG. 1, the color photoresist layer 30 includes a color filter region configured to transmit specific color light. The color photoresist layer 30 may include a plurality of color filter regions, each of the plurality of color filter regions may respectively include pigments 150 or dyes 170 configured to express different colors and quantum dots 200 having different sizes. For example, the color photoresist layer 30 may include first, second, and third color filter regions 30R, 30G, and 30B, respectively configured to transmit first, second, and third color lights. A block pattern 35 may be disposed between the first, second, and third color filter regions 30R, 30G, and 30B. The first color filter region 30R may include a first color photoresist which includes at least one of a first pigment and/or a first dye and first quantum dots for a first color light. The first pigment and the first dye may be configured to express the first color light, and the first quantum dots may be configured to generate the first color light. The second color filter region 30G may include a second color photoresist which includes at least one of a second pigment and/or a second dye and second quantum dots for a second color light. The second pigment and the second dye may be configured to express the second color light, and the second quantum dots may be configured to generate the second color light. The third color filter region 30B may include a third color photoresist which includes at least one of a third pigment and/or a third dye and third quantum dots for a third color light. The third pigment and the third dye may be configured to express the third color light, and the third quantum dots may be configured to generate the third color light. The first, second, and third quantum dots may have different sizes, respectively configured to generate the first, second, and third colors of light. The first, second, and third color photoresist included in the first, second, and third color filter regions 30R, 30G, and 30B may respectively include first, second, and third metal nanoparticles, and the first, second, and third metal nanoparticles may have different shapes. Each of the first, second, and third metal nanoparticles may have a plurality of sides, and respective corners of the first, second, and third metal nanoparticles may have different shapes.

The first, second, and third color filter regions 30R, 30G, and 30B are respectively configured to receive incident light and transmit light having wavelengths corresponding to the first, second, and third color filter regions 30R, 30G, and 30B. Light wavelengths respectively transmitted by the first, second, and third color filter regions 30R, 30G, and 30B may correspond with the pigment 150, the dye 170, the size of the quantum dots 200, and the type and shape of the metal nanoparticles 250 included therein.

The first, second, and third color filter regions 30R, 30G, and 30B may correspond to, for example, a red filter region, a green filter region, and a blue filter region, respectively. Accordingly, the first color filter region 30R may include the pigment 150 and/or the dye 170 configured to express a red color, the quantum dots 200 having a size configured to generate the red light, and the metal nanoparticles 250 having corners formed in a sharp shape as will be described later. The second color filter region 30G may include the pigment 150 and/or the dye 170 configured to express a green color, the quantum dots 200 having a size configured to generate the green light, and the metal nanoparticles 250 having corners formed in a slightly round shape as will be described later. The third color filter region 30B may include the pigment 150 and/or the dye 170 configured to express a blue color, the quantum dots 200 having a size configured to generate the blue light, and the metal nanoparticles 250 having corners formed in a round shape as will be described later.

The quantum dots 200 having increased size of cores may have longer maximum absorption wavelengths. On the other hand, the quantum dots 200 having decreased size of the cores may have shorter maximum absorption wavelengths. Accordingly, the first, second, and third color filter regions 30R, 30G, and 30B respectively corresponding to the red filter region, the green filter region, and the blue filter region may respectively include the first, second, and third color photoresist respectively including the first, second, and third quantum dots having sizes of D1, D2, and D3, respectively, wherein the sizes D1, D2, and D3 satisfy a relationship of D1>D2>D3. When the first, second, and third quantum dots have core-shell structures, the size of a quantum dot may denote the size of the cores of the first, second, and third quantum dots.

For example, when the first color filter region 30R is a red filter region configured to emit red light, the first quantum dots included in the first color filter region 30R may have a core size of about 5 nm and a maximum absorption at a wavelength of about 635 nm. When the second color filter region 30G is a green filter region configured to emit green light, the second quantum dots included in the second color filter region 30G may have a core size of about 3 nm and a maximum absorption at a wavelength of about 533 nm. When the third color filter region 30B is a blue filter region configured to emit blue light, the third quantum dots included in the third color filter region 30B may have a core size of about 1.7 nm and a maximum absorption at a wavelength of about 434 nm.

The first, second, and third quantum dots may include at least one of, but not limited thereto, Si-based nanocrystal, Group II and VI elements-containing compound semiconductor nanocrystal, Group III and V elements-containing compound semiconductor nanocrystal, Group IV and VI elements-containing compound semiconductor nanocrystal. The Group II and VI elements-containing compound semiconductor nanocrystal may be one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe. The Group III and V elements-containing compound semiconductor nanocrystal may be one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The Group IV and VI elements-containing compound semiconductor nanocrystal may be SbTe. Each of the first, second, and third quantum dots may have a core-shell structure including a core and a shell. Each of the quantum dots 200 may have a nearly circular shape, and thus has a unique excitation wavelength and a unique emission wavelength according to the sizes of the quantum dots 200. Thus, the first, second, and third quantum dots may have sizes configured to respectively generate red, green, and blue light, and the first through third color filter regions 30R, 30G, and 30B respectively including the first, second, and third quantum dots may respectively serve as red, green, and blue filters configured to respectively transmit a red light, a green light, and a blue light.

The metal nanoparticles 250 may include at least one of metal material, but not limited to, Au, Ag, Al, Al2O3, Co, Cu, Cr, Pt, Ni, Fe, Mo, and W.

Each of the metal nanoparticles 250 may have a plurality of sides. For example, each of the metal nanoparticles 250 may have a shape including at least one corner. The metal nanoparticles 250 may be configured to generate extinction in a wavelength band according to the type of material included in the metal nanoparticles 250 and/or the shape of the corner of the metal nanoparticles 250.

A cross-section shape of each of the metal nanoparticles 250 may be a triangle. For example, the cross-section of each of the metal nanoparticles 250 may have a triangular shape including at least one of chamfered corner. The metal nanoparticles 250 may have a corner shape corresponding to the color filter region. The triangular metal nanoparticles 250 may have different extinction characteristics according to the shapes of corners of the nanoparticles 250, because denser polarization appears at a sharp corner. The triangular metal nanoparticles 250 including more chamfered corners may be configured to generate extinction at a lower wavelength. The triangular metal nanoparticles 250 including sharper corner may be configured to generate extinction at a higher wavelength. As the corners of each of the triangular metal nanoparticles 250 are more chamfered, the metal nanoparticles 250 may have more circular shape.

Accordingly to the first, second, and third quantum dots respectively included in the first, second, and third color filter regions 30R, 30G, and 30B may respectively have sizes D1, D2, and D3 satisfying D1>D2>D3, where the metal nanoparticles 250 included in the first, second, and third color photoresist included in the first, second, and third color filter regions 30R, 30G, and 30B may respectively be referred to as first, second, and third metal nanoparticles, and the corner shape of the metal nanoparticles may be more chamfered in the order of the first metal nanoparticles, the second metal nanoparticles, and the third metal nanoparticles.

The metal nanoparticles 250 have different polarization densities according to the shape of the corner shape. Sharper corner may be configured to generate denser polarization. Thus, the metal nanoparticles 250 may be configured to generate extinction at different wavelength ranges according to the shape of the corner of the metal nanoparticles 250.

Figure 4A:
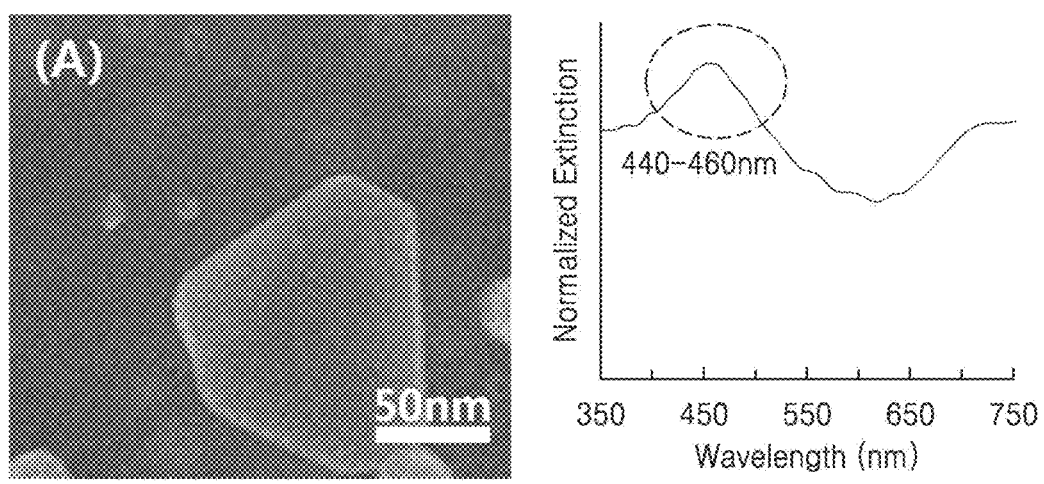
FIGS. 4A, 4B, and 4C are extinction characteristic curves, according to one or more exemplary embodiments.
Figure 4B:
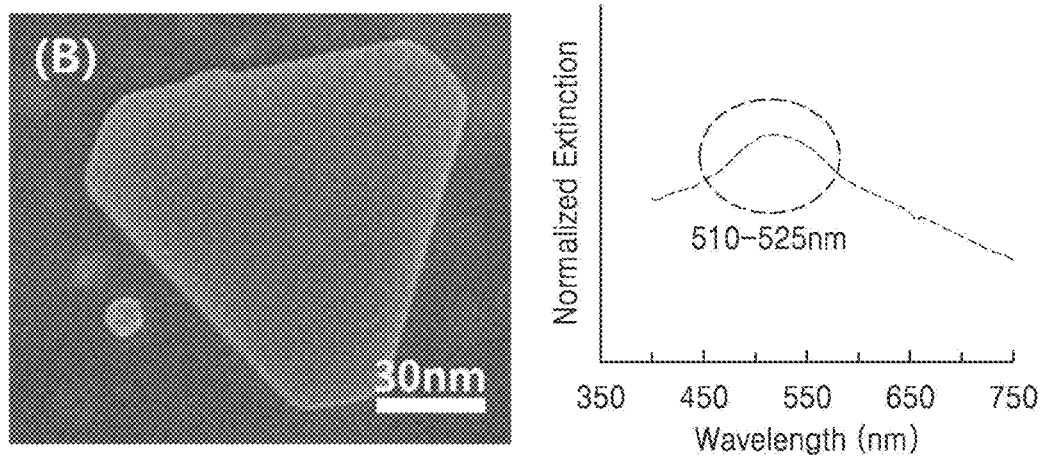
Figure 4C:
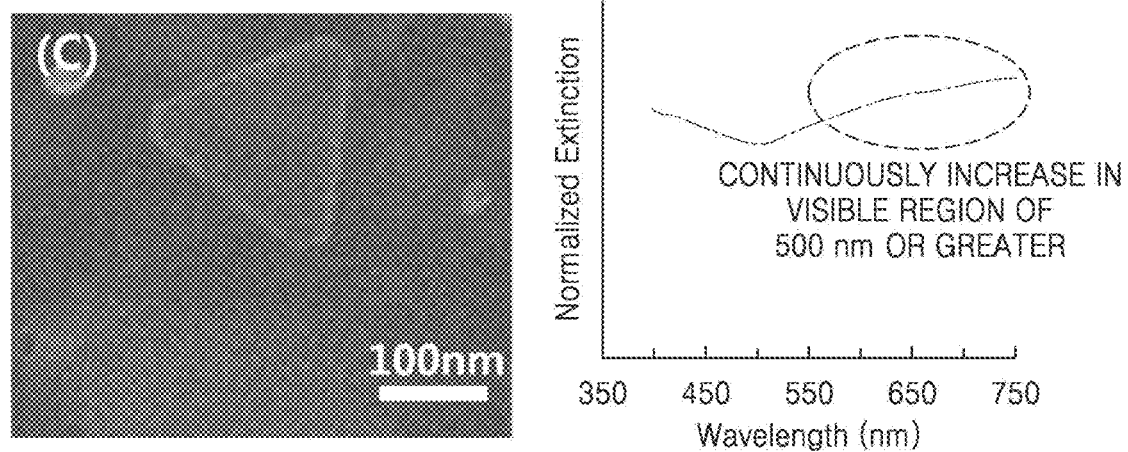

FIGS. 4A, 4B, and 4C are extinction characteristic curves according to the shapes of the corner of the metal nanoparticles 250, according to one or more exemplary embodiments. Extinction characteristics of FIGS. 4A, 4B, and 4C show that, a triangular silver (Ag) nanoparticle may have sides each having a size of from about 70 nm to about 130 nm may be configured to generate extinction of a wavelength according to the corner shapes of the triangular Ag nanoparticle.

Referring to an image (A) of FIG. 4A, a triangular metal nanoparticle 250 may have sides having a relatively round shape. Referring to the graph of FIG. 4A, the triangular metal nanoparticle 250 may be configured to generate greatest extinction at a blue wavelength, for example, at a wavelength of about 440-460 nm.

Referring to an image (B) of FIG. 4B, a triangular metal nanoparticle 250 may have sides having a slightly round shape. Referring to the graph of FIG. 4B, the triangular metal nanoparticle 250 may be configured to generate greatest extinction at a green wavelength, for example, at a wavelength of about 510-525 nm.

Referring to an image (C) of FIG. 4C, a triangular metal nanoparticle 250 may have sides having a sharp shape. Referring to the graph of FIG. 4C, the triangular metal nanoparticle 250 may be configured to generate greatest extinction at a red wavelength, for example, at a wavelength of about 500 nm or greater.

Referring back to FIGS. 4A, 4B, and 4C, the triangular metal nanoparticle 250 having rounder corners may be configured to generate extinction at a shorter wavelength. The triangular metal nanoparticle 250 having sharper corners may be configured to generate extinction at a longer wavelength.

Thus, when the first, second, and third color filter regions 30R, 30G, and 30B of the color filter 10, according to one or more exemplary embodiments, respectively corresponds to a red filter region, a green filter region, and a blue filter region, the first, second, and third color filter regions 30R, 30G, and 30B may include metal nanoparticles 250 having, for example, corner shapes as shown in FIGS. 4C, 4B, and 4A, respectively.

Accordingly, as the color photoresist included in the color photoresist layer 30 may include the quantum dots 200 and the metal nanoparticles 250, the metal nanoparticles 250 may increase the extinction of photons at a specific wavelength according to the electromagnetic characteristics of the material, and the increased extinction of photons at the specific wavelength may increase the excitation of electrons of quantum dots 200 around the metal nanoparticles 250. Thus, the excitation of the electrons of the quantum dots 200 due to this localized surface plasmon resonance may increase light emission of the quantum dots 200 at a specific wavelength.

Thus, the color photoresist including the quantum dots 200 and the metal nanoparticles 250 according to one or more exemplary embodiments may have increased light emission at the specific wavelength compared to conventional color photoresist having only the quantum dots 200, and therefore, the color photoresist including the quantum dots 200 and the metal nanoparticles 250 may improve the brightness of the color filter 10.

The first, second, and third color photoresist included in the first, second, and third color filter regions 30R, 30G, and 30B may further include the alkyl groups 270 bonded with the metal nanoparticles 250.

Figure 5:
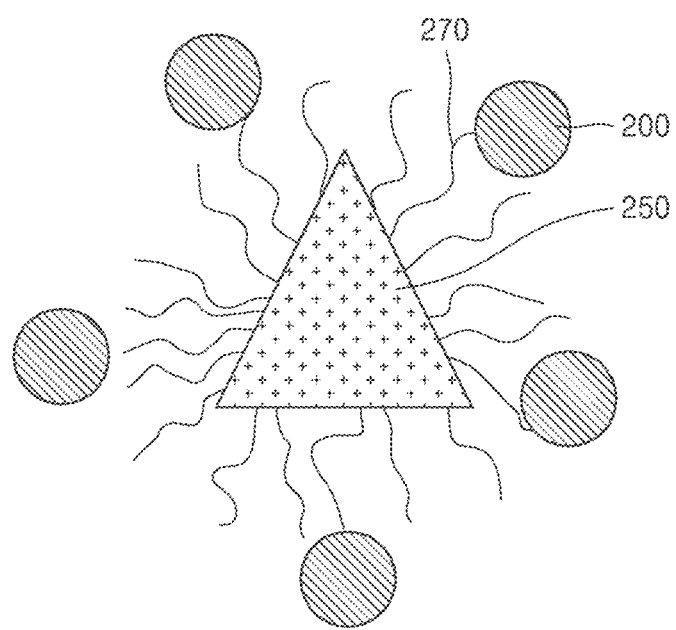
FIG. 5 is a metal particle bonded with alkyl groups, according to one or more exemplary embodiments.

FIG. 5 is a metal particle bonded with alkyl groups 270, according to one or more exemplary embodiments. Accordingly to the one or more exemplary embodiments, the alkyl groups 270 bonded with the metal nanoparticles 250 may maintain a distance between the metal nanoparticles 250 and the quantum dots 200 from the inclusion of the alkyl groups 270. Accordingly, the color photoresist may reduce the agglomeration of the metal nanoparticles 250 and the quantum dots 200.

Referring to FIGS. 2, 3D, and 3E, the color photoresist further includes the alkyl groups 270 bonded with the metal nanoparticles 250, and the alkyl groups 270 may maintain the distance between the metal nanoparticles 250 and the quantum dots 200.

The metal nanoparticles 250 bonded with the alkyl groups 270 may be evenly distributed within the color photoresist layer 30, and the agglomeration of the metal nanoparticles 250 and the quantum dots 200 may be reduced. The metal nanoparticles 250 bonded with the alkyl groups 270 may be configured to have relatively uniform sizes, and accordingly, the agglomeration of the metal nanoparticles 250 with the quantum dots 200 may be reduced.

Figure 6A:
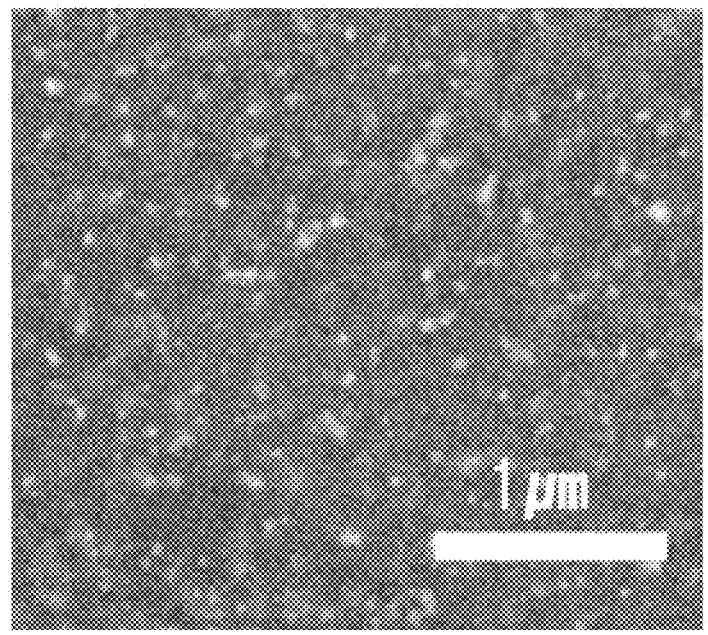
FIG. 6A illustrates a color photoresist including metal nanoparticles bonded with alkyl groups, according to one or more exemplary embodiments.
Figure 6B:
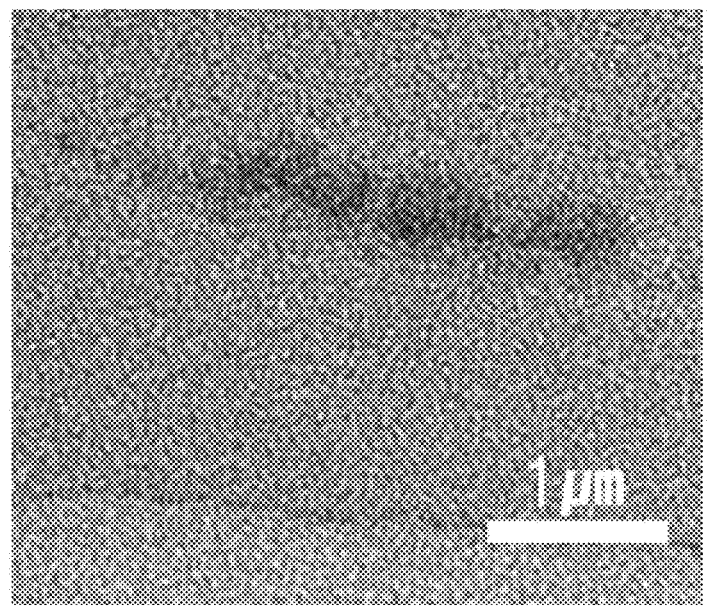
FIG. 6B illustrates a color photoresist including metal nanoparticles not bonded with alkyl groups, according to a comparative example.

FIG. 6A illustrates the color photoresist including the metal nanoparticles 250 bonded with alkyl groups, according to one or more exemplary embodiments. FIG. 6B illustrates a comparative example of the color photoresist including the metal nanoparticles 250 not bonded with the alkyl groups 270.

The alkyl groups 270 bonded with the metal nanoparticles 250 may determine the distances between the metal nanoparticles 250 and the quantum dots 200, and may determine magnification efficiency of the electrons of the quantum dots 200 accordingly. Thus, the distance between the metal nanoparticles 250 and the quantum dots 200 formed by bonding of the alkyl groups 270 may be controlled to increase the magnification efficiency of the electrons of the quantum dots 200 and increase the brightness. The alkyl groups 270 may serve as the dispersing agent 130 and a leveling agent with respect to the metal nanoparticles 250.

Figure 7A:
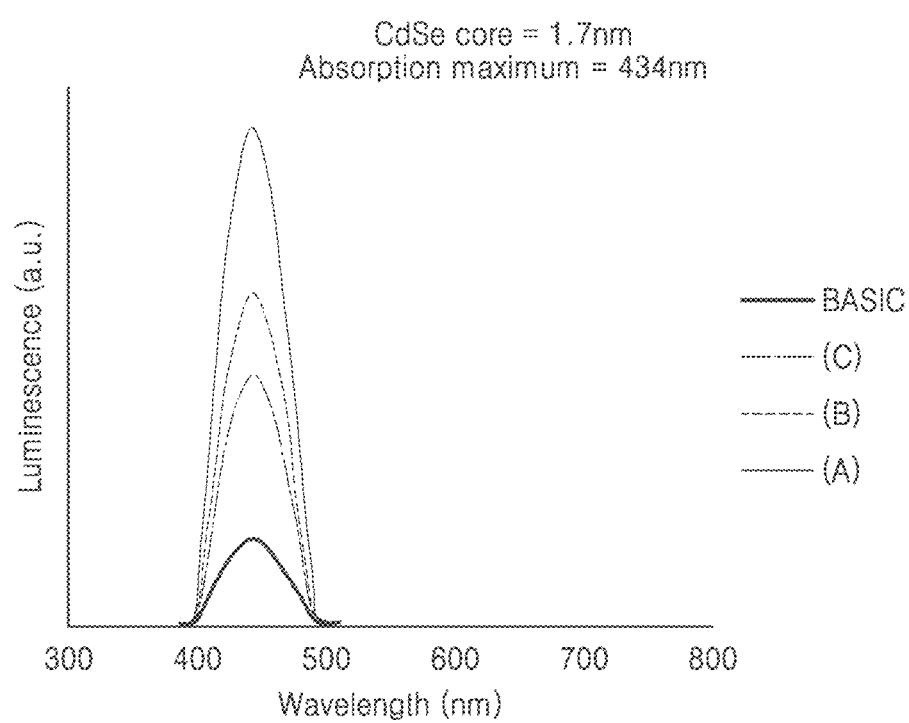
FIGS. 7A, 7B, and 7C illustrate emission characteristics of the quantum dots according to the shapes of the metal nanoparticles, according to one or more exemplary embodiments.
Figure 7B:
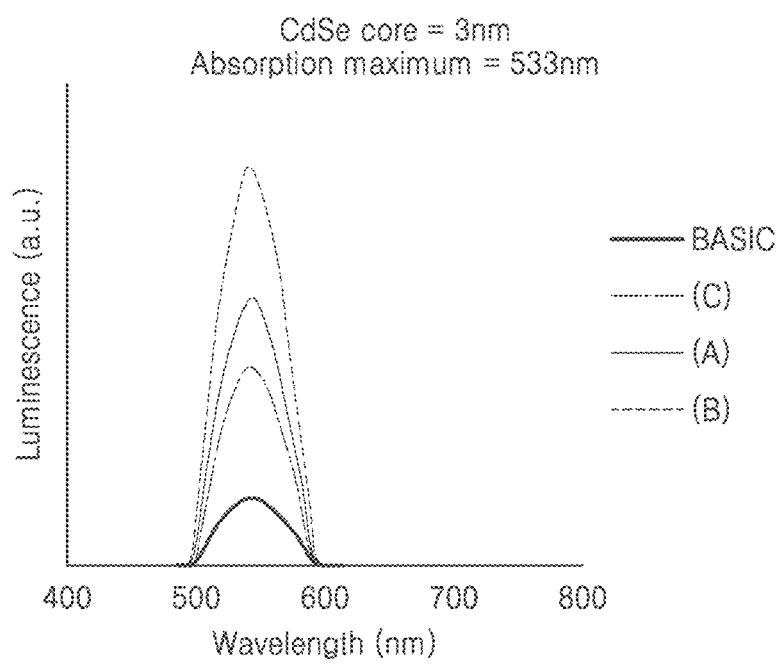
Figure 7C:
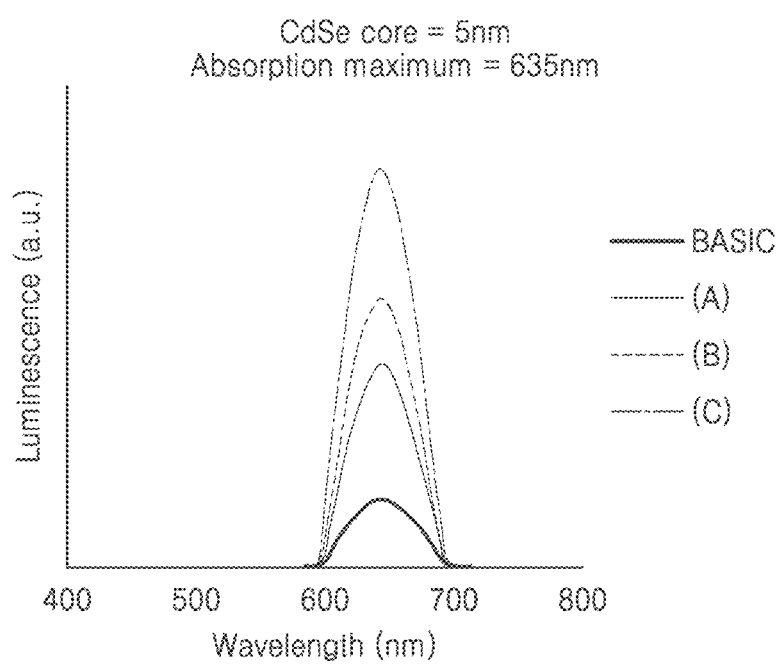

FIGS. 7A, 7B, and 7C illustrate light emission characteristics of the quantum dots 200 according to the shapes of the metal nanoparticles 250, according to one or more exemplary embodiments. FIG. 7A shows a luminescence intensity of the light emitted from the quantum dots 200 according to shapes of the metal nanoparticles 250, when the quantum dots 200 include the CdSe core size of about 1.7 nm and have a maximum absorption wavelength of about 434 nm. FIG. 7B shows a luminescence intensity of the light emitted from the quantum dots 200 according to the shapes of the metal nanoparticles 250, when the quantum dots 200 include the CdSe core size of about 3 nm and have a maximum absorption wavelength of about 533 nm. FIG. 7C shows a luminescence intensity of the light emitted from the quantum dots 200 according to the shapes of the metal nanoparticles 250, when the quantum dots 200 include the CdSe core size of about 5 nm and have a maximum absorption wavelength of about 635 nm. According to FIGS. 7A, 7B, and 7C, the luminescence intensity of the light emitted from the quantum dots 200 corresponds with a combination of the quantum dots 200 and the shape of the metal nanoparticles 250.

Referring to FIGS. 7A, 7B, and 7C, "basic" indicates the luminescence intensity of the light emitted from the quantum dots 200 not coupled with any metal nanoparticles 250, and (A), (B), and (C) indicate the luminescence intensity of the light emitted from the quantum dots 200 combined with the metal nanoparticles 250 respectively having the corner shapes of FIGS. 4A, 4B, and 4C.

Referring to FIG. 7A, when the quantum dots 200 include the CdSe having a core size of about 1.7 nm and a maximum absorption wavelength of about 434 nm, the light emitted from the quantum dots 200 has greatest luminescence intensity when coupled with the metal nanoparticles 250 having round corners and configured to generate greatest extinction at a wavelength of about 440-460 nm as shown in FIG. 4A.

Referring to FIG. 7B, when the quantum dots 200 include the CdSe having a core size of about 3 nm and a maximum absorption wavelength of about 533 nm, the light emitted from the quantum dots 200 has greatest luminescence intensity when coupled with the metal nanoparticles 250 configured to generate greatest extinction at a wavelength of about 510-525 nm as shown in FIG. 4B.

Referring to FIG. 7C, when the quantum dots 200 includes the CdSe having a core size of about 5 nm and a maximum absorption wavelength of about 635 nm, the light emitted from the quantum dots 200 has greatest luminescence intensity when coupled with the metal nanoparticles 250 having sharp corners and configured to generate larger extinction as a wavelength increases within a visible light region of about 500 nm or greater as shown in FIG. 4C.

Referring to FIGS. 7A, 7B, and 7C, when the metal nanoparticles 250 configured to generate greatest extinction characteristics at a specific wavelength are combined with the quantum dots 200 configured to have greatest excitation characteristics at the specific wavelength, excitation of the electrons of the quantum dots 200 may be improved, and brightness may be increased. In other words, the increase in the extinction of photons at the specific wavelength may increase the excitation of the electrons of quantum dots 200 around the metal nanoparticles 250, and in turn, increase the light emission. Accordingly, the luminescence intensity of the light emitted from the quantum dots 200 may be proportional to the extinction of the metal nanoparticles 250.

Figure 8:
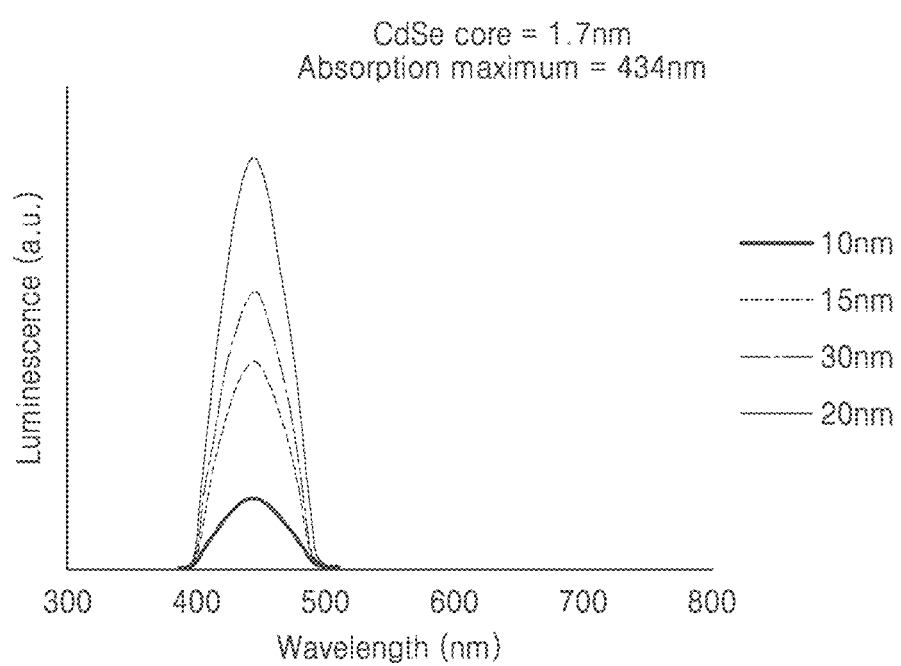
FIG. 8 illustrates luminescence characteristics according to a distance between the metal nanoparticles and the quantum dots, according to one or more exemplary embodiments.

FIG. 8 illustrates luminescence characteristics according to a distance between the metal nanoparticles 250 and the quantum dots 200, according to one or more exemplary embodiments. FIG. 8 shows a luminescence intensity according to a distance between the metal nanoparticles 250 and the quantum dots 200 when the quantum dots 200 having a CdSe core size of about 1.7 nm and having a maximum absorption wavelength of about 434 nm are coupled. According to FIG. 8, the luminescence of the light emitted from the quantum dots 200 corresponds with a combination of the quantum dots 200 and the distance between the quantum dots 200 and the metal nanoparticles 250.

FIG. 8 illustrates the luminescence intensity of the light emitted from the quantum dots 200 when distances between the metal nanoparticles 250 and the quantum dots 200 are 10 nm, 15 nm, 20 nm, and 30 nm, respectively. According to the exemplary embodiment illustrated in FIG. 8, the luminescence intensity is the greatest when the distance between the metal nanoparticles 250 and the quantum dots 200 is 20 nm.

According to comparative technology, the light emitted from the quantum dots 200 may be quenched by a metal material, and the color filter may have a degraded brightness. In comparison, the color filter 10 according to one or more exemplary embodiments, the metal nanoparticles 250 are spaced apart from the quantum dots 200 by a distance corresponding to a specific wavelength by bonding the alkyl groups 270 with the metal nanoparticles 250 may have improved luminescence. The increase in the luminescence may be proportional to energy transmissibility from the metal nanoparticles 250 to the quantum dots 200.

Figure 9A:
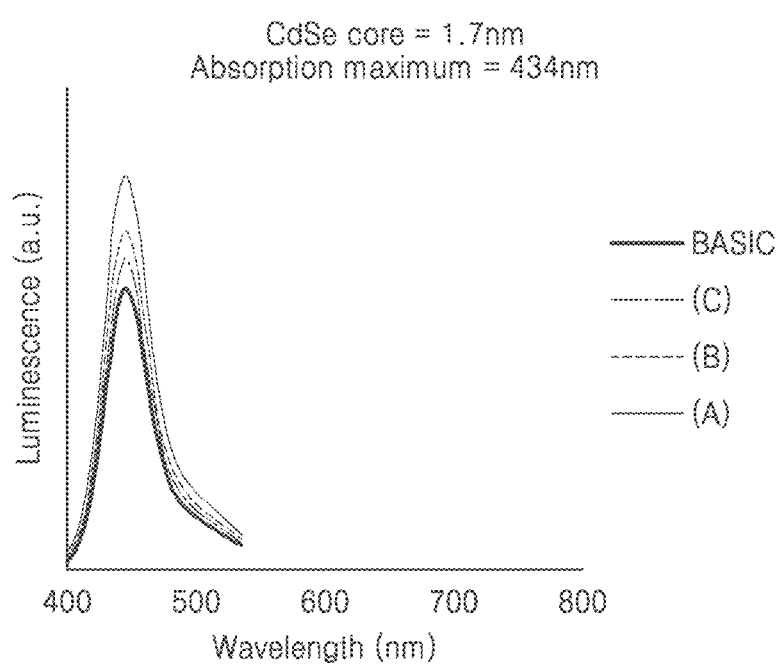
FIGS. 9A, 9B, and 9C illustrate luminescence characteristics of quantum dots according to the shapes of metal nanoparticles, according to one or more exemplary embodiments.
Figure 9B:
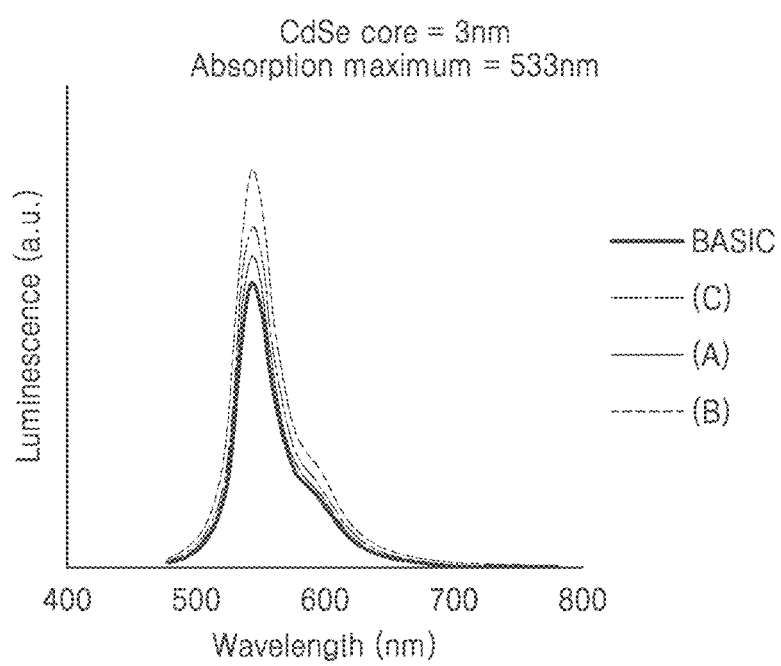
Figure 9C:
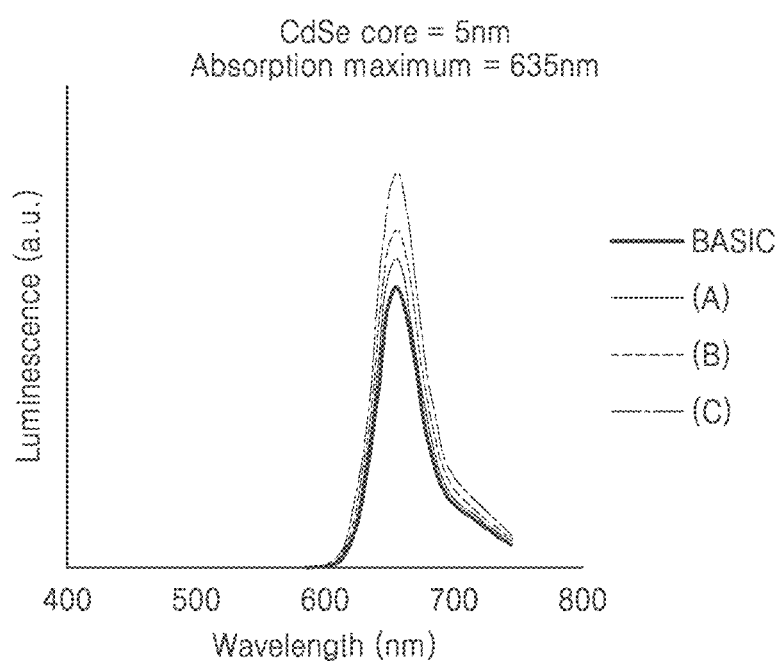

FIGS. 9A, 9B, and 9C illustrate luminescence intensity characteristics of the quantum dots 200 included the color photoresist according to the shapes of the metal nanoparticles 250, according to one or more exemplary embodiments. FIG. 9A shows a luminescence intensity of the light emitted from the quantum dots 200 included in the color photoresist according to the shapes of the metal nanoparticles 250, when the quantum dots 200 include the CdSe core size of about 1.7 nm and have a maximum absorption wavelength of about 434 nm. FIG. 9B shows a luminescence intensity of the light emitted from the quantum dots 200 included in the color photoresist according to the shapes of the metal nanoparticles 250, when the quantum dots 200 include the CdSe core size of about 3 nm and have a maximum absorption wavelength of about 533 nm. FIG. 9C shows a luminescence intensity of the light emitted from the quantum dots 200 included in the color photoresist according to the shapes of the metal nanoparticles 250, when the quantum dots 200 include the CdSe core size of about 5 nm and have a maximum absorption wavelength of about 635 nm. The luminescence intensities of FIGS. 9A, 9B, and 9C are luminescence intensities of the quantum dots 200 when included in color photoresist for the color filter 10 including the metal nanoparticles 250.

Referring to FIGS. 9A, 9B, and 9C, "basic" indicates the luminescence intensity of the light emitted from the quantum dots 200 when metal nanoparticles 250 are not included in the color photoresist, and (A), (B), and (C) indicate the luminescence intensity of the light emitted from the quantum dots 200 when metal nanoparticles 250 respectively having the corner shapes of FIGS. 4A, 4B, and 4C are respectively included in the color photoresist.

Referring to FIG. 9A, when the quantum dots 200 include the CdSe having a core size of about 1.7 nm and a maximum absorption wavelength of about 434 nm, the light emitted from the quantum dots 200 has greatest luminescence intensity when the metal nanoparticles 250 having round corners and configured to generate extinction at a wavelength of about 440-460 nm as shown in FIG. 4A are included in the color photoresist. The quantum dots 200 show increased luminescence intensities even without the metal nanoparticles 250.

Referring to FIG. 9B, when the quantum dots 200 include CdSe having a core size of about 3 nm and a maximum absorption wavelength of about 533 nm, the light emitted from the quantum dots 200 has the greatest luminescence intensity when the metal nanoparticles 250 having slightly round corners and configured to generate extinction at a wavelength of about 510-525 nm as shown in FIG. 4B are included in the color photoresist. The quantum dots 200 show increased luminescence intensities even without the metal nanoparticles 250.

Referring to FIG. 9C, when the quantum dots 200 include the CdSe having a core size of about 5 nm and a maximum absorption wavelength of about 635 nm the light emitted from the quantum dots 200 has greatest luminescence intensity when the metal nanoparticles 250 having sharp corners and configured to generate larger extinction as a wavelength increases within a visible light region of about 500 nm or greater as shown in FIG. 4C. The quantum dots 200 show increased luminescence intensities even without the metal nanoparticles 250.

Referring to FIGS. 9A, 9B, and 9C, even when the photoresist including the quantum dots 200 is included in the color filter 10, the color filter 10 may have improved luminescence. The color filter 10 including both the quantum dots 200 and the metal nanoparticles 250 may have further improved luminescence.

Referring to FIGS. 9A, 9B, and 9C, the quantum dots 200 may have a narrow color-formation wavelength, and thus, may have improved color reproducibility. Moreover, the metal nanoparticles 250 may increase excitation and emission of the quantum dots 200, and thus, the color filter 10 may have amplified brightness.

Figure 10:
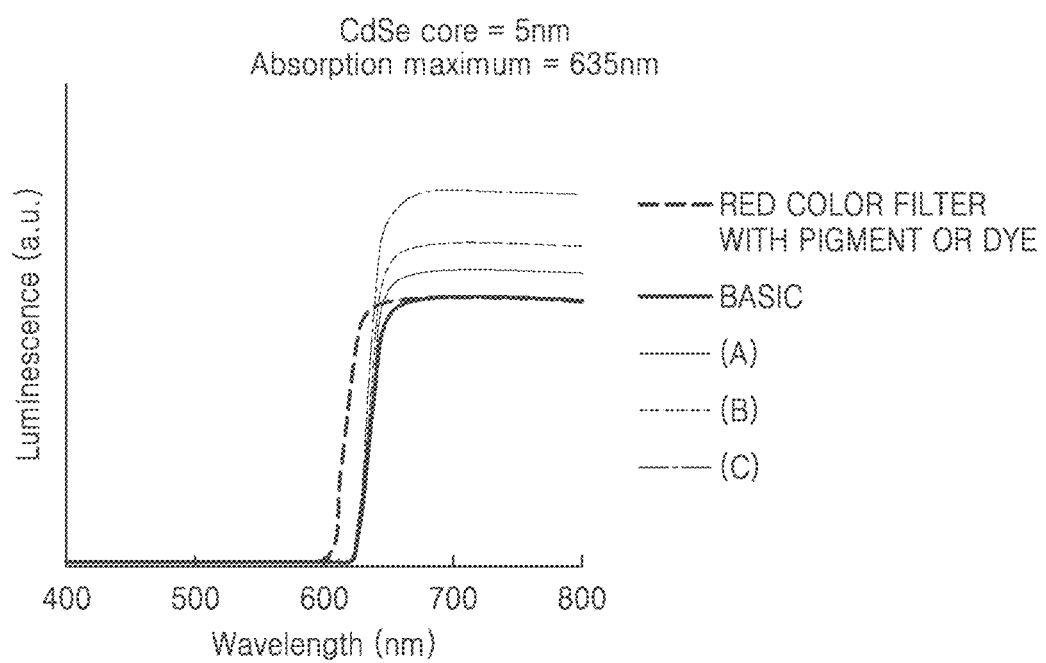
FIG. 10 illustrates luminescence characteristics of quantum dot included in a red color filter according to one or more exemplary embodiments having the same shape as that of a comparative embodiment of a color filter including pigment and/or dye.

Referring back FIG. 9C, the luminescence intensity distribution of the red filter may have amplification within a narrow wavelength. FIG. 10 illustrates the luminescence intensity distribution characteristics quantum dot included in the red color filter according to one or more exemplary embodiments having the same shape as that that of a comparative embodiment of the dye-type color filter including the pigment 150 and/or the dye 170.

Referring to FIG. 10, "red filter including pigment and/or dye" indicates the luminescence intensity of the light emitted from a comparative embodiment of a red filter including the pigment 150 and/or the dye 170, "basic" indicates the luminescence intensity of the light emitted from the quantum dots 200 when the metal nanoparticles 250 are not included in the color photoresist, and (A), (B), and (C) indicate the luminescence intensity of the light emitted from the quantum dots 200 when metal nanoparticles 250 respectively having the corner shapes of FIGS. 4A, 4B, and 4C are respectively included in the color photoresist.

Referring to FIG. 10, the quantum dots 200 include a CdSe having the core size of about 5 nm and a maximum absorption wavelength of about 635 nm may have greatest emission when coupled with the metal nanoparticles 250 having sharp corners and configured to generate larger extinction as a wavelength increases within a visible light region of about 500 nm or greater as shown in FIG. 4C.

The color filter 10 including the quantum dots 200 and the metal nanoparticles 250 may have increased excitation of the quantum dots 200, and the quantum dots 200 may have increased light emission. When a distance between the metal nanoparticles 250 and the quantum dots 200 is maintained by attaching grafting molecules to the metal nanoparticles 250, degrading of the brightness from quenching of the quantum dots 200 may be reduced. Even when the shapes of the metal nanoparticles 250 are not spherical, the metal nanoparticles 250 may form a spherical shape by having the grafting molecules including, for example, the alkyl groups 270 attached to the metal nanoparticles 250. Thus, the grafting molecules including, for example, the alkyl groups 270, may serve as the dispersing agent 130 and a leveling agent that does not affect dispersion.

According to the exemplary embodiments, the color filter 10 includes the first through third color filter regions 30R, 30G, and 30B configured to generate the three color light beams, the exemplary embodiments are not limited thereto. The color filter 10 according to one or more exemplary embodiments may include two color filter regions or at least four color filter regions.

The color filter 10 according to one or more exemplary embodiments may be applied to displays configured to display colors. For example, the color filter 10 according to one or more exemplary embodiments may display a color by arranging color filter regions corresponding with a plurality of pixel regions of a display unit controlled according to an image signal. The display unit may include, but not limited to, a transmissive LC panel, reflective LC panel, or an organic light-emitting panel. The color filter 10 according to the one or more exemplary embodiments disposed on the side of a display surface of a display may reduce the reflection of external light, and accordingly, a circular polarization film that is included in comparative embodiments may be omitted. The color filter 10 according to one or more exemplary embodiments may also be included in solid state imaging devices, such as CCD image sensors and CMOS image sensors.

Figure 11:
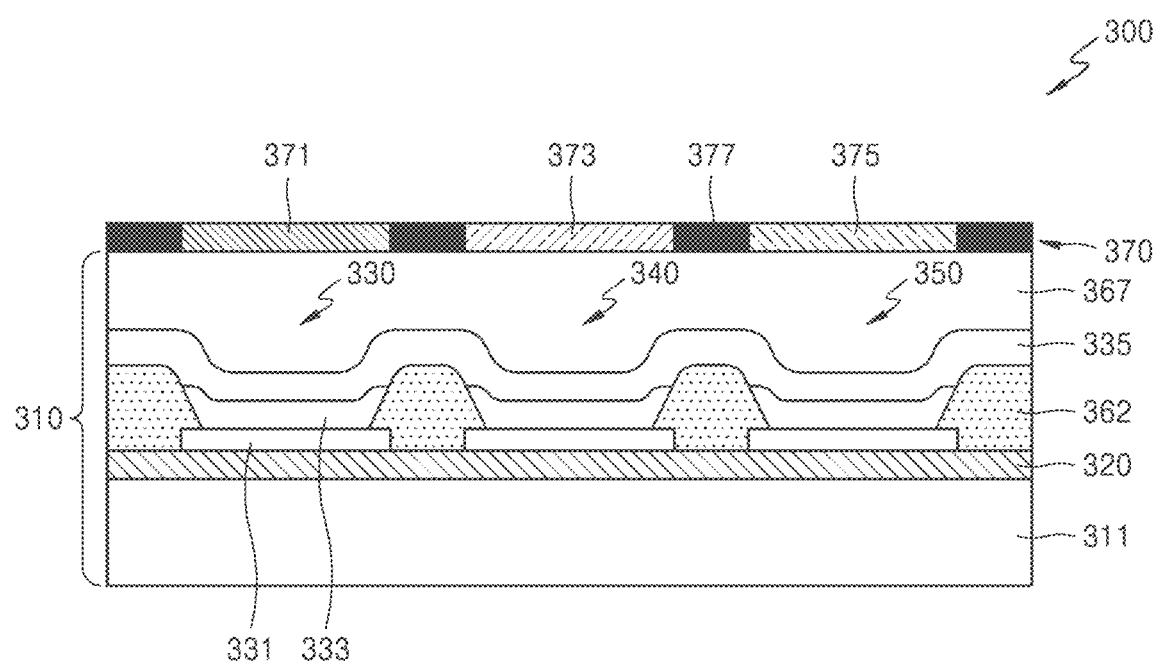
FIG. 11 is a cross-sectional view of an organic light-emitting display, according to one or more exemplary embodiments.

FIG. 11 is a cross-sectional view of an organic light-emitting display 300, according to one or more exemplary embodiments.

Referring to FIG. 11, the organic light-emitting display 300 may include an OLED panel 310 and a color filter 370. The OLED panel 310 includes a driving circuit unit 320 disposed on a substrate 311, and an array of OLEDs 330, 340, and 350 disposed on the driving circuit unit 320. Each of the OLEDs 330, 340, and 350 may include an anode 331, an organic emission layer 333, and a cathode 335.

The organic emission layer 333 of each of the OLEDs 330, 340, and 350 is illustrated as a single layer, but the exemplary embodiments are not limited thereto, and the organic emission layer 333 may include a plurality of layers including a hole injection layer (HIL), a hole transport layer (HTL), an emissive layer (EML), an electron transport layer (ETL), and an electron injection layer (EIL).

A pixel defining layer 362 may be disposed between the OLEDs 330, 340, and 350. In other words, after the anode 331 serving as a pixel electrode is disposed on the driving circuit unit 320, the pixel defining layer 362 including an insulating material is disposed on the driving circuit unit 320 such that at least a portion of an upper surface of the anode 331 is exposed. The organic emission layer 333 and the cathode 335 are sequentially disposed on the exposed upper surface of the anode 331, and a capping layer 367 configured to protect the organic emission layer 333 is disposed on the cathode 335.

The anode 331 may be a reflective electrode. The anode 331 may be a reflective layer including at least one of Ag, Mg, Al, Pt, Pd, Au, Ni, Nd, Ir, and Cr, and a transparent layer including at least one of indium tin oxide (ITO), indium zinc oxide (IZO), zinc oxide (ZnO), indium oxide ($In_2O_3$), indium gallium oxide (IGO), and aluminum zinc oxide (AZO). For example, the anode 331 may have a stacked structure including, for example, ITO, Ag, and ITO layers alternatingly stacked.

The cathode 335 may be a transparent electrode or a translucent electrode configured to transmit the light emitted from the organic emission layer 333. For example, the cathode 335 may include a layer including at least one of Li, Ca, LiF/Ca, LiF/Al, Al, and Mg disposed facing the organic emission layer 333, and a transparent layer including at least one of ITO, IZO, ZnO, and $In_2O_3$ on the layer. The cathode 335 may have a stacked structure including, for example, Ag and Mg layers stacked alternatingly.

The color filter 370 may be disposed on the path of the light transmitted and emitted by the cathode 335. For example, the color filter 370 may be disposed on the capping layer 367.

The exemplary embodiments illustrates a top emission type, but the exemplary embodiments are not limited thereto, and the OLED panel 310 may be a bottom-emission type. Accordingly, compared to the top emission type, the cathode 335 may be a reflective electrode and the anode 331 may be a transparent electrode or a translucent electrode. The cathode 335 may include a reflective layer including at least one of Li, Ca, LiF/Ca, LiF/Al, Al, Ag, and Mg. The anode 331 may include at least one of indium tin oxide (ITO), indium zinc oxide (IZO), zinc oxide (ZnO), indium oxide ($In_2O_3$), indium gallium oxide (IGO), and aluminum zinc oxide (AZO). The anode 331 may be a transparent electrode have a stacked structure including ITO, Ag, and ITO layers stacked alternatingly.

The configurations of the anode 331 and the cathode 335 and the materials respectively used to form the anode 331 and the cathode 335 according to the one or more exemplary embodiments are not limited to the above descriptions, and various modifications may be made thereto.

The color filter 370 may be disposed on the path of the light transmitted and emitted by the anode 331. In other words, the color filter 370 may be disposed on the side of a rear surface of the substrate 311 or may be disposed between the driving circuit unit 320 and the substrate 311.

When a forward voltage is applied between the anode 331 and the cathode 335, electrons from the cathode 335 move to the organic emission layer 333 through an EIL and an ETL, and holes from the anode 331 move to the organic emission layer 333 through an HIL and an HTL. The electrons and holes injected into the organic emission layer 333 recombine with each other in the organic emission layer 333 and form excitons, and light is transmitted according to a transition of the excitons from an excited state to a ground state. The brightness of the emitted light is proportional to the amount of current flowing between the anode 331 and the cathode 335.

The driving circuit unit 320 includes a circuit that drives each pixel of the OLED panel 310. For example, the driving circuit unit 320 may include a gate line, a data line perpendicularly intersecting with the gate line, a switching thin film transistor (TFT) connected to the gate line and the data line, a driving TFT disposed between the switching TFT and a power line and connected to an OLED, and a storage capacitor connected between a gate electrode of the driving TFT and the power line.

The amount of current supplied to each of the OLEDs 330, 340, and 350 is controlled according to a data signal, and control the brightness of each of the OLEDs 330, 340, and 350. The data signal is controlled according to an image signal.

The OLEDs 330, 340, and 350 may emit white light. The OLEDs 330, 340, and 350 may be, for example, a red OLED emitting red light, a green OLED emitting green light, and a blue OLED emitting blue light, respectively.

The color filter 370 may include first, second, and third color filter regions 371, 373, and 375 arranged to respectively correspond to the OLEDs 330, 340, and 350, and a block pattern 377 may be disposed between the first, second, and third color filter regions 371, 373, and 375. The first, second, and third color filter regions 371, 373, and 375 may include, for example, a red filter region configured to transmit red light, a green filter region configured to transmit green light, and a blue filter region configured to transmit blue light. The color filter 370 may be the color filter 10 of FIG. 1. In other words, the first, second, and third color filter regions 371, 373, and 375 and the block pattern 377 of the color filter 370 may respectively correspond to the first through third color filter regions 30R, 30G, and 30B and the block pattern 35 of the color filter 10 of FIG. 1.

When the OLEDs 330, 340, and 350 emit white light, red light from the white light emitted from the OLED 330 is transmitted through the first color filter region 371 corresponding to the OLED 330, green light from the white light emitted from the OLED 340 is transmitted through the second color filter region 373 corresponding to the OLED 340, and blue light from the white light emitted from the OLED 350 is transmitted through the third color filter region 375 corresponding to the OLED 350. Thus, the driving circuit unit 320 controls the amounts of light respectively emitted by the OLEDs 330, 340, and 350 according to a data signal, and may display a color image.

When the OLEDs 330, 340, and 350 are respectively a red OLED configured to emit red light, a green OLED configured to emit green light, and a blue OLED configured to emit blue light, the red light emitted from the OLED 330 is transmitted through the first color filter region 371 corresponding to the OLED 330, the green light emitted from the OLED 340 is transmitted through the second color filter region 373 corresponding to the OLED 340, and blue light emitted from the OLED 350 is transmitted through the third color filter region 375 corresponding to the OLED 350. Thus, the driving circuit unit 320 controls the amounts of light respectively emitted from the OLEDs 330, 340, and 350 according to a data signal, and may display a color image.

Figure 12:
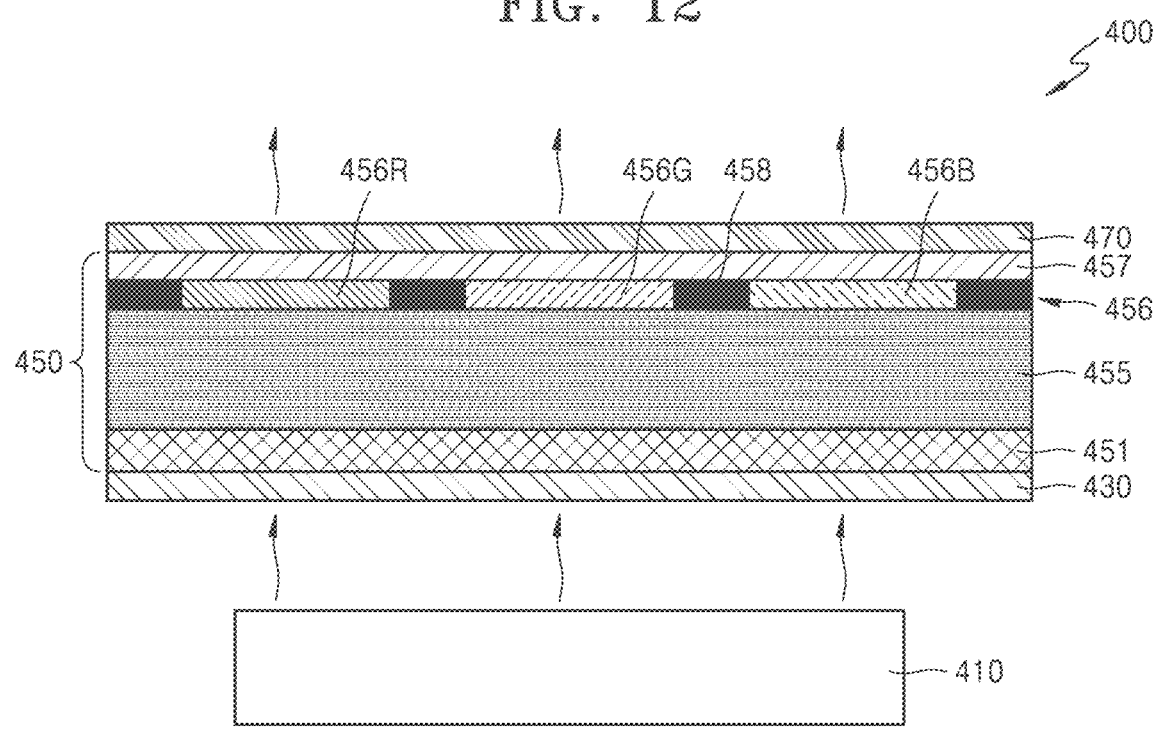
FIG. 12 is a cross-sectional view of a transmission-type liquid crystal display (LCD) according to, one or more exemplary embodiments.

FIG. 12 is a cross-sectional view of a transmission-type liquid crystal display (LCD) 400 according to one or more exemplary embodiments.

Referring to FIG. 12, the transmission-type LCD 400 includes a backlight unit 410, an Liquid Crystal (LC) panel 450, and two polarizing plates 430 and 470. The backlight unit 410 may be disposed on a rear surface of the LC panel 450. The LC panel 450 may include a first substrate 451, a second substrate 457, an LC layer 455 interposed between the first substrate 451 and the second substrate 457, and a color filter 456. The two polarizing plates 430 and 470 may be disposed on the first substrate 451 and the second substrate 457. The LC panel 450 may include the two polarizing plates 430 and 470.

The color filter 456 may be formed directly on a substrate included in the LC panel 450, or may be formed separately and coupled to the LC panel 450. For example, the color filter 456 may be disposed on one of the first substrate 451 and/or the second substrate 457. FIG. 12 illustrates an exemplary embodiment including the color filter 456 disposed on the second substrate 457.

When a base substrate on which the color filter 456 is disposed is referred to as a color filter substrate, the LC panel 450 may include the color filter substrate on which the color filter 456 may be, for example, the second substrate 457, an opposite substrate facing the color filter substrate may be, for example, the first substrate 451, and the LC layer 455 interposed between the color filter substrate and the opposite substrate. FIG. 12 schematically illustrates the LC panel 450 and thus may omit a pixel electrode, a common electrode, and a driving unit.

The color filter 456 may include first, second, and third color filter regions 456R, 456G, and 456B, and a block pattern 458 may be disposed between the first, second, and third color filter regions 456R, 456G, and 456B. The first, second, and third color filter regions 456R, 456G, and 456B may include, for example, a red filter region configured to transmit red light, a green filter region configured to transmit green light, and a blue filter region configured to transmit blue light. The color filter 456 may be the color filter 10 of FIG. 1. In other words, the first, second, and third color filter regions 456R, 456G, and 456B and the block pattern 458 of the color filter 456 may respectively correspond to the first, second, and third color filter regions 30R, 30G, and 30B and the block pattern 35 of the color filter 10 of FIG. 1.

Figure 13:
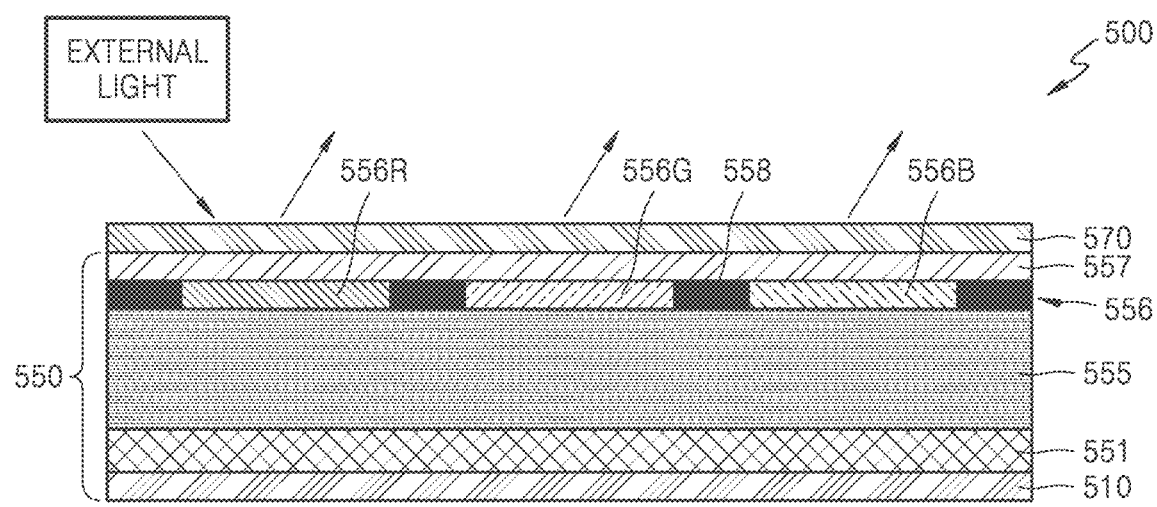
FIG. 13 is a cross-sectional view of a reflection-type LCD, according to one or more exemplary embodiments.

FIG. 13 is a cross-sectional view of a reflection-type LCD 500, according to one or more exemplary embodiments.

Referring to FIG. 13, the reflection-type LCD 500 uses external light as a light source and may include a single polarizing plate 570 and an LC panel 550. The LC panel 550 may include a first substrate 551, a second substrate 557, an LC layer 555 interposed between the first substrate 551 and the second substrate 557, and a color filter 556. The polarizing plate 570 may be disposed on the second substrate 557. The LC panel 550 may include the polarizing plate 570.

The color filter 556 may be formed directly on a substrate included in the LC panel 550, or may be formed separately and coupled to the LC panel 550. A reflection layer 510 may be formed on a lower surface of the LC panel 550. For example, the color filter 556 may be disposed on one of the first substrate 551 and/or the second substrate 557. FIG. 13 illustrates an exemplary embodiment including the color filter 556 disposed on the second substrate 557.

When a base substrate on which the color filter 556 is disposed is referred to as a color filter substrate, the LC panel 550 may include the color filter substrate on which the color filter 556 may be, for example, the second substrate 557, an opposite substrate facing the color filter substrate may be, for example, the first substrate 551, and the LC layer 555 interposed between the color filter substrate and the opposite substrate. FIG. 13 schematically illustrates the LC panel 550 and thus may omit a pixel electrode, a common electrode, and a driving unit.

The color filter 556 may include first, second, and third color filter regions 556R, 556G, and 556B, and a block pattern 558 may be disposed between the first, second, and third color filter regions 556R, 556G, and 556B. The first, second, and third color filter regions 556R, 556G, and 556B may include, for example, a red filter region configured to transmit red light, a green filter region configured to transmit green light, and a blue filter region configured to transmit blue light. The color filter 556 may be the color filter 10 of FIG. 1. In other words, the first, second, and third color filter regions 556R, 556G, and 556B and the block pattern 558 of the color filter 556 may respectively correspond to the first, second, and third color filter regions 30R, 30G, and 30B and the barrier pattern 35 of the color filter 10 of FIG. 1.

According to one or more exemplary embodiments, a color filter and a display apparatus including the color filter may include quantum dots in color photoresist and may have improved color reproducibility and brightness. The color photoresist including metal nanoparticles may further improve the brightness.

According to one or more exemplary embodiments, the color filter may be disposed on the side of a display surface of a display, and the display may reduce the reflection of external light, and accordingly may omit a circular polarization film which is typically included to reflect external light in comparative embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A color filter comprising:
    a base substrate; and
    a color photoresist layer disposed on the base substrate, the color photoresist layer comprising:
        a first color filter region configured to generate a light of a first color wavelength, the first color filter region comprising at least one of a first pigment or a first dye, first quantum dots, and first metal nanoparticles, wherein the first metal nanoparticles are spaced apart from the first quantum dots by first alkyl groups; and
        a second color filter region configured to generate a light of a second color wavelength, the second color filter region comprising at least one of a second pigment or a second dye, second quantum dots, and second metal nanoparticles, wherein the second metal nanoparticles are spaced apart from the second quantum dots by second alkyl groups, wherein:
        the first color filter region is different from the second color filter region,
        each of the first metal nanoparticles has a first polygon shape,
        each of the second metal nanoparticles has a second polygon shape, and
        a corner portion of the first polygon shape is sharper than a corner portion of the second polygon shape.

2. The color filter of claim 1, wherein each of the first and second metal nanoparticles comprises a plurality of sides and at least one corner formed by the plurality of sides.

3. The color filter of claim 1, wherein a cross-sectional shape of each of the first and second polygon shapes is a triangle in which at least one corner is chamfered.

4. The color filter of claim 3,
    wherein the corner portion of the second polygon shape is relatively more round than the corner portion of the first polygon shape.

5. The color filter of claim 1, wherein a distance between one of the first metal nanoparticles and one of the first quantum dots is determined by one of the first alkyl groups, and
    a distance between one of the second metal nanoparticles and one of the second quantum dots is determined by one of the second alkyl groups.

6. The color filter of claim 1, wherein
    the color photoresist layer further comprises:
    a third color filter region configured to generate a light of a third color wavelength, the third color filter region comprising at least one of a third pigment, a third dye and third quantum dots, and third metal nanoparticles, wherein the third metal nanoparticles are spaced apart from the third quantum dots by third alkyl groups, and
    wherein the first, second, and third quantum dots have different sizes, configured to respectively generate the light of the first color wavelength, the light of the second color wavelength, and the light of the third color wavelength.

7. The color filter of claim 6, wherein
    the first, second, and third metal nanoparticles have different shapes.

8. The color filter of claim 7, wherein the first, second, and third quantum dots have sizes of $D_1$, $D_2$, and $D_3$, relatively, wherein the sizes $D_1$, $D_2$, and $D_3$ satisfy relationship of $D_1 > D_2 > D_3$, and
    wherein at least one corner of the first, second, and third metal nanoparticles are more chamfered to rounder shape in an order of the first metal nanoparticles, the second metal nanoparticles, and the third metal nanoparticles.

9. The color filter of claim 8, wherein the first, second, and third color filter regions are configured to generate a red color, a green color, and a blue color, respectively.

10. The color filter of claim 7, wherein the first, second, and third alkyl groups are bonded respectively with the first, second, and third metal nanoparticles,
    wherein a distance between the first metal nanoparticles and the first quantum dots, a distance between the second metal nanoparticles and the second quantum dots, and a distance between the third metal nanoparticles and the third quantum dots are respectively determined by the first, second, and third alkyl groups.

11. A display apparatus comprising:
    a display unit comprising first and second pixel regions which are controlled according to an image signal; and
    a color filter comprising first and second color filter regions corresponding to the first and second pixel regions, wherein:
    a first color filter region configured to generate a light of a first color wavelength, the first color filter region comprising at least one of a first pigment or a first dye, first quantum dots, and first metal nanoparticles, wherein the first metal nanoparticles are spaced apart from the first quantum dots by first alkyl groups; and
    a second color filter region configured to generate a light of a second color wavelength, the second color filter region comprising at least one of a second pigment or a second dye, second quantum dots, and second metal nanoparticles, wherein the second metal nanoparticles are spaced apart from the second quantum dots by second alkyl groups,
    wherein:
    the first color filter region is different from the second color filter region,
    each of the first metal nanoparticles has a first polygon shape,
    each of the second metal nanoparticles has a second polygon shape, and
    a corner portion of the first polygon shape is sharper than a corner portion of the second polygon shape.

12. The display apparatus of claim 11, wherein
    the first and second color filter regions further comprise:
    a third color filter region comprising at least one of a third pigment or a third dye, third quantum dots, and the third color filter region is configured to generate a light of a third color wavelength, and wherein the first, second, and third quantum dots have different sizes to respectively configured to generate the light of the first color wavelength, the light of the second color wavelength, and the light of the third color wavelength.

13. The display apparatus of claim 12, wherein
the third color filter region comprises third metal nanoparticles, and
the first, second, and third metal nanoparticles have different shapes.

14. The display apparatus of claim 13, wherein the first, second, and third quantum dots have sizes of $D_1$, $D_2$, and $D_3$, respectively, wherein the sizes $D_1$, $D_2$, and $D_3$ satisfy relationship of $D_1 > D_2 > D_3$, and
wherein at least one corner of the first, second, and third metal nanoparticles are more chamfered to rounder shape in an order of the first metal nanoparticles, the second metal nanoparticles, and the third metal nanoparticles.

15. The display apparatus of claim 11, wherein the display unit is selected from a group consisting a transmissive liquid crystal (LC) panel, a reflective LC panel, and an organic light-emitting panel.

16. A display apparatus comprising:
a display unit comprising a plurality of pixel regions which are controlled according to an image signal; and
a color filter comprising a first color filter region, a second color filter region, and a third color filter region that are configured to generate different color light from each other, wherein:
the first color filter region includes a first quantum dot configured to generate a light of a first color wavelength, a first metal nanoparticle configured to increase extinction of photons at the first color wavelength, and one of a first pigment and a first dye,
the second color filter region includes a second quantum dot configured to generate a light of a second color wavelength, a second metal nanoparticle configured to increase extinction of photons at the second color wavelength, and one of a second pigment and a second dye, and
the third color filter region including a third quantum dot configured to generate a light of a third color wavelength, a third metal nanoparticle configured to increase extinction of photons at the third color wavelength, and one of a third pigment and a third dye, and wherein:
the first color filter region, the second color filter region, and the third color filter region are different from each other,
each of the first metal nanoparticles has a first shape,
each of the second metal nanoparticles has a second shape,
each of the third metal nanoparticles has a third shape, and
each of the first, second, and third shape is a substantially triangular shape, a corner portion of the first shape is sharper than a corner portion of the second shape, and the corner portion of the second shape is sharper than a corner portion of the third shape.

17. The display apparatus of claim 16, wherein:
the first, second, and third quantum dots have sizes of $D_1$, $D_2$, and $D_3$, respectively, wherein the sizes $D_1$, $D_2$, and $D_3$ satisfy relationship of $D_1 > D_2 > D_3$, and
the corner portions of the first, second, and third shapes of the first, second, and third metal nanoparticles are changed from a sharp shape to a round shape in an order of the first, second, and third metal nanoparticles.

* * * * *